United States Patent [19]

Mukai et al.

[11] Patent Number: 4,607,370
[45] Date of Patent: Aug. 19, 1986

[54] PAIRED, SEPARATELY CONTROLLED, AND COUPLED OR UNCOUPLED STRIPE GEOMETRY SEMICONDUCTOR LASERS

[75] Inventors: Seiji Mukai; Eli Kapon; Joseph Katz, all of Pasadena; Shlomo Margalit, South Pasadena; Amnon Yariv, San Marino, all of Calif.

[73] Assignee: California Institute of Technology, Pasadena, Calif.

[21] Appl. No.: 584,822

[22] Filed: Feb. 29, 1984

[51] Int. Cl.$^4$ .............................................. H01S 3/19
[52] U.S. Cl. ...................................... 372/50; 357/17; 372/46
[58] Field of Search ...................... 372/50, 44, 45, 46, 372/23; 357/17

[56] References Cited

U.S. PATENT DOCUMENTS 4,426,704  1/1984  Nagai et al. ........................... 372/50

OTHER PUBLICATIONS

Sakai, et al., "InGaAsP/InP Dual Wavelength Lasers," Electron. Lett., 18(1), Jan. 7, 1982, pp. 17–18.
Sakai, et al., "Dual Wavelength InGaAsP/InP TJS Lasers," Electron. Lett., 18(1), Jan. 7, 1982, pp. 18–20.
Hayakawa, et al., "Highly Reliable and Mode-Stabilized Operation in V-Channeled Substrate Inner Stripe Lasers on p-GaAs Substrate Emitting in the Visible Wavelength Region," J. Appl. Phys., 53(11), Nov. 1982, pp. 7224–7234.
Tsang, et al., "CW Multiwavelength Transverse-Junction-Stripe Lasers Grown by Molecular Beam Epitaxy Operating Predominantly in Single-Longitudinal Modes," Appl. Phys. Lett., 36(6), Mar. 15, 1980, pp. 441–443.
Boudama, et al., Electron. Lett., 18(20) Sep. 30, 1982, pp. 871–873, "Dual-Wavelength (GaAl)As Laser".
Tsang, et al., "High-Speed Direct Single-Frequency Modulation with Large Tuning Rate and Frequency Excursion in Cleaved-Coupled-Cavity Semiconductor Lasers," Appl. Phys. Lett., 42(8), Apr. 15, 1983, pp. 650–652.
Tsang, et al., "Single-Longitudinal Mode Performance Characteristics of Cleaved-Coupled-Cavity Lasers," Appl. Phys. Lett., 43(11), Dec. 1, 1983, pp. 1003–1005.
Choi, et al., "Semiconductor Internal-Reflection-Interference Laser," Appl. Phys. Lett., 40(7), Apr. 1, 1982, pp. 571–573.
Tsang, et al., "Transient Single-Longitudinal Mode Stabilization in Double Active Layer GaInAsP/InP Laser Under High-Bit Rate Modulation," Appl. Phys. Lett., 42(12), Jun. 15, 1983, pp. 1003–1005.

*Primary Examiner*—James W. Davie
*Attorney, Agent, or Firm*—Freilich, Hornbaker, Rosen & Fernandez

[57] ABSTRACT

An integrated laser structure for paired stripe semiconductor lasers is provided with separate current control of each stripe laser. With optical coupling between the lasers, one of the lasers is operated below threshold and serves the longitudinal mode selection and tunability of the other laser, thereby to obtain a single longitudinal mode operation. Without coupling, the paired-laser structure operates as a source of two independent wavelengths.

14 Claims, 15 Drawing Figures

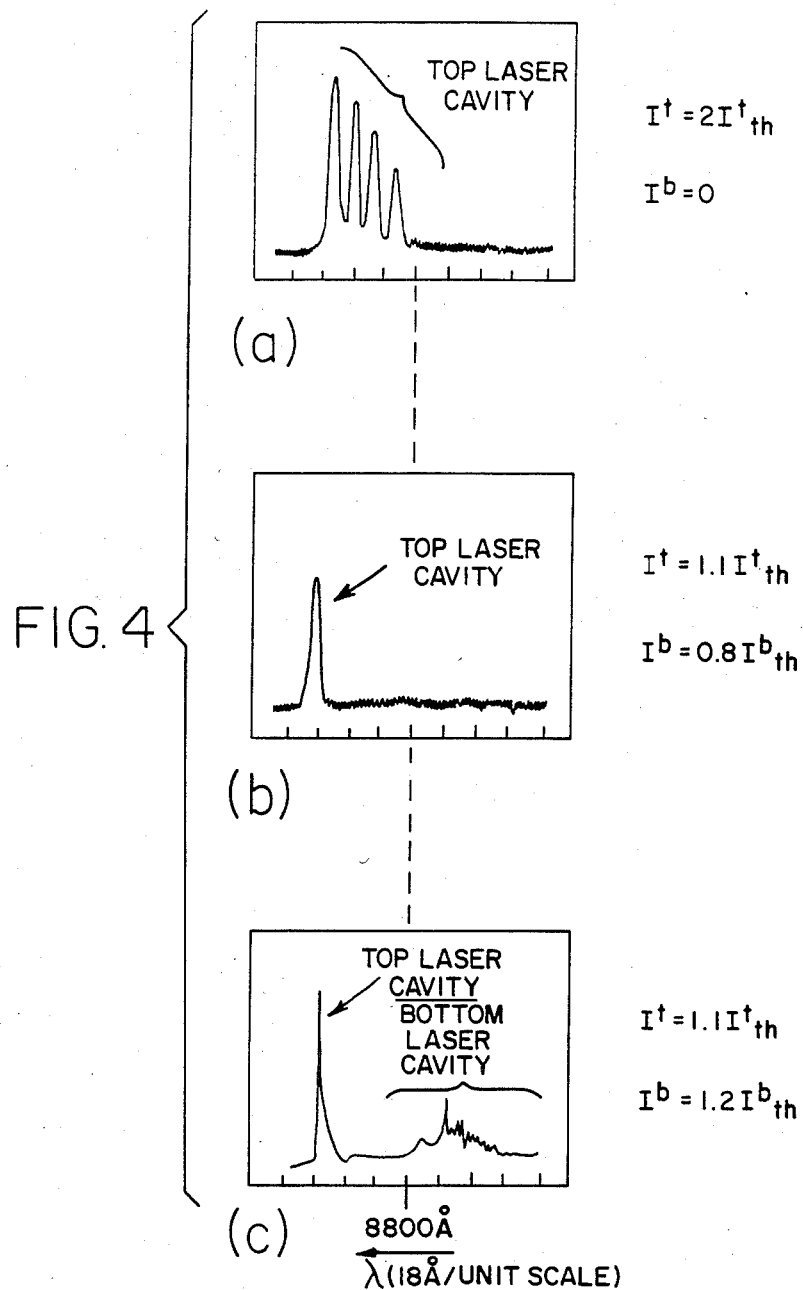

4,607,370

PAIRED, SEPARATELY CONTROLLED, AND COUPLED OR UNCOUPLED STRIPE GEOMETRY SEMICONDUCTOR LASERS

ORIGIN OF INVENTION

This invention was made jointly by the Applied Physics Department of the California Institute of Technology under contracts with the Office of Naval Research and the National Science Foundation, and the Jet Propulsion Laboratory under contract with the National Aeronautics and Space Administration.

BACKGROUND OF THE INVENTION

This invention relates to stripe semiconductor laser structures, and more particularly to two stripe lasers in an integrated circuit with separate contacts for control current and with their ends at a cleaved face being disposed to emit their separate beams in an area sufficiently small (about 5 $\mu$m) to couple both into a fiber optic. A further feature is that, when operating one below threshold while the other is operated above threshold, control of the one serves the longitudinal mode selection and tunability of the other laser.

It is well known that tandem coupled cavity lasers possess a high degree of selectivity compared to single cavity semiconductor lasers. This selectivity is due to the additional constraints imposed on the oscillation condition by the added cavity. By current control of the coupled (extra) cavity, it has been possible to tune the output of such lasers over significant regions. See W. T. Tsang, N. A. Olsson and R. A. Logan, "High-speed direct single-frequency modulation with large tuning rate and frequency excursion in cleaved-coupled-cavity semiconductor lasers," Appl. Phys, Lett. 42(8) Apr. 15, 1983, pp 650–52. An example is a semiconductor internal-reflection-interference (IRI) laser described by Hong K. Choi and Shyh Wang, Appl. Phys. Lett. 40(7), Apr. 1, 1982, at pages 571–73. In this particular case, the mode selectivity and tunability are affected by the interference which is caused by internal reflections from a transverse notch in the waveguide channel.

It has been reported recently by W. T. Tsang, et al., "Transient single-longitudinal mode stabilization in double active layer GaInAsP/InP laser under high-bit rate modulation," Appl. Phys. Lett. 42(12), June 15, 1983 at pages 1003–05 that longitudinal mode selectivity can also be achieved by coupling two or more semiconductor laser cavities in parallel. However, in that case the two cavities were not separately controlled.

OBJECTS AND SUMMARY OF THE INVENTION

An object of this invention is to provide an integrated circuit laser structure which provides the ability to tune the wavelength of a single output beam, or the ability to provide two independent laser beams for special applications, such as for fiber optic and laser communication systems.

This object is achieved in a semiconductor stripe laser structure comprised of two separately controlled stripe laser cavities in different active layers separated by an inactive layer. When the two cavities are arranged so that there is optical coupling between them, the output wavelength spectrum of one of the coupled cavities is controlled through variations of the gain and refractive index of the other of the coupled cavities by control of current injection below threshold. It is thus clear that separate contacts for the coupled stripe lasers is essential, one contact for current to one stripe laser operating above threshold, and the other contact for control current to the other stripe laser operating below threshold.

If the coupling between the two laser cavities is reduced, such as by the spacing or arrangement of the two cavities, or by increasing the thickness of the coupling layer between them, the two cavities can operate above threshold at independent wavelengths, yet the two beams may be so close that they can both be directed into the end of a single-mode optical fiber for transmission in a fiber optic communication system. In the case of a thinner coupling layer, a single output beam fine tuned by the second cavity controlled below threshold, as described above, can be used for fiber optic communication.

The novel features of the invention are set forth with particularity in the appended claims. The invention will best be understood from the following description when read in connection with the accompanying drawings.

BRIEF DESCRIPTION OF THE DRAWINGS

FIG. 4a illustrates the wavelength spectrum control of the CPW laser structure of FIG. 1 with the top laser cavity operating alone and above threshold.

FIG. 4b illustrates the wavelength spectrum control of the CPW laser structure of FIG. 1 with the top laser cavity operating above threshold, and the bottom laser cavity operated below threshold.

FIG. 4c illustrates the wavelength spectrum control of the CPW laser structure of FIG. 1 with both laser cavities operating above threshold.

DESCRIPTION OF PREFERRED EMBODIMENTS

Figure 1:
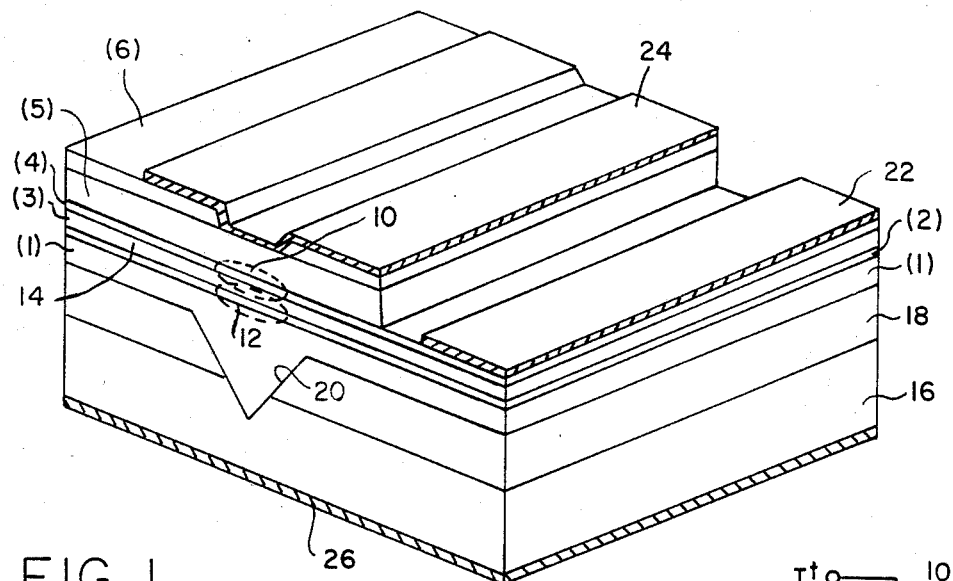
FIG. 1 is an isometric view of a coupled-parallel-waveguide (CPW) laser structure embodying the present invention.

Referring to FIG. 1, a coupled-parallel-waveguide (CPW) laser is shown in an isometric view comprised of two parallel and separately controlled individual stripe laser cavities 10 (top laser cavity) and 12 (bottom laser cavity) in separate active semiconductor layers placed one on top of the other, with an optical coupling layer 14 between the two. One of the laser cavities (control cavity) is operated below threshold to assist the longitudinal mode selection and tuning of the other. If both are operated above threshold, two beams are produced, but then wavelength tuning must be achieved by other known techniques. Still there is an advantage in that two independent laser beams are produced very close to each other. In fact, if the CPW laser is to be used in that way, the coupling layer may be purposely made of such a material and/or thickness as to reduce coupling, but not so thick that the principal advantage of the structure in this mode of operation would be lost, namely the advantage of being able to couple both laser beams directly into the end of a single mode optical fiber for some fiber optic communication system requiring two independent beams to be transmitted over the same path. By pretuning each to a different wavelength, for example, by zinc diffusion into one of the cavities, it is possible to separately detect them at the other end using a beam splitter to direct both to one detector of one wavelength and also to another detector of the other wavelength.

Figure 2:
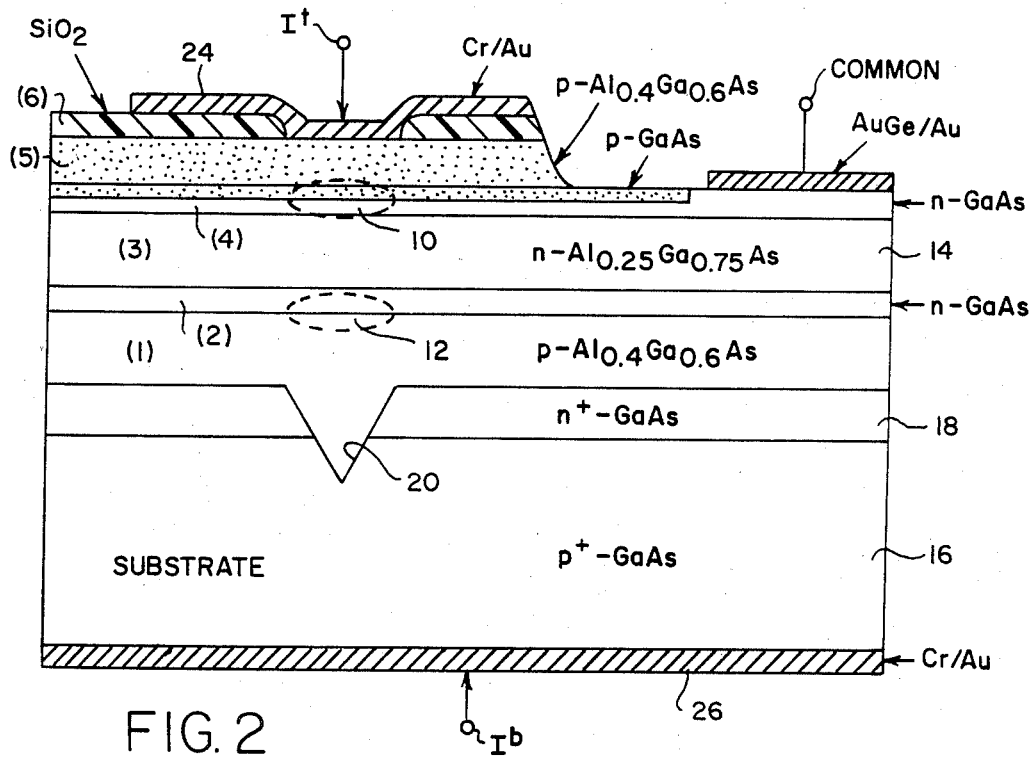
FIG. 2 is a transverse cross section of the CPW laser structure shown in FIG. 1.

Referring next to FIG. 2, which shows a transverse cross section (or the cleaved face shown in FIG. 1, but to larger scale), fabrication of the device involves a two-step liquid-phase epitaxy (LPE) growth on a $p^+$(Zn doped) GaAs substrate 16. In the first LPE step a single $n^+$GaAs layer 18 is grown ($\sim 2$ μm; Tedoped, $\sim 6 \times 10^{18}$ cm$^{-3}$). Next, a 10 μm wide and $\sim 3$ μm deep groove 20 is etched parallel to <011> direction using a 1:8:8 ($H_2SO_4:H_2O:H_2O_2$) solution. In the second LPE growth, five layers are grown: (1) 0.9 μm p-$Al_{0.4}Ga_{0.6}As$; (2) 0.2 μm n-GaAs (active region of bottom laser; Sn-doped, $6 \times 10^{17}$cm$^{-3}$); (3) 1.0 μm n-$Al_{0.25}Ga_{0.75}As$ (the optical coupling layer); (4) 0.2 μm n-GaAs (active region of top laser; Sn-doped, $6 \times 10^{17}$ cm$^{-3}$); (5) 2 μm n-$Al_{0.4}Ga_{0.6}As$. The two top layers (4 and 5) can then be converted into $p^+$-type regions by Zn diffusion as indicated by the uniform stippling of the entire upper layer (5), and the upper region of the next lower layer (4) out to but not under (not in ohmic contact) an AuGe/Au film which serves as a common contact 22. This is accomplished by diffusion of the zinc through the upper layer(5) to the desired level of the next layer (4) over the region shown for the lower layer (4) before the upper layer (5) is etched to expose the lower layer (4) in the region that has not been diffused with zinc, i.e., in the n-GaAs region, where the contact 22 common to both active regions (2 and 4) is to be vapor deposited. But first, an oxide bordered stripe contact ($\sim 8$ μm m wide) is fabricated above the V-groove 20 to form one contact of the top laser (see FIG. 1). This is accomplished by depositing an insulating layer (6) of $SiO_2$, etching a stripe over the groove 20 and then depositing a top contact 24 on the exposed top layer (5). Then on one side of the stripe contact, the wafer is etched down to the top active layer (4) where it has not been converted to a p-type region and the AuGe/Au contact 22 is evaporated on the etched area. Finally, the wafer is lapped and a Cr/Au contact 26 is evaporated on the substrate side.

The CPW laser structure described with reference to FIGS. 1 and 2 consists of two parallel gainguided stripe lasers which are coupled optically, but can be controlled independently. The top laser cavity is a conventional gain-guided laser cavity in that current is confined by the oxide on each side of the stripe contact whereas in the bottom laser cavity, current confinement is accomplished by the $n^+$-GaAs blocking layer on each side of the V groove. For a more complete understanding of the operation of the bottom laser cavity by itself, see "Highly reliable and mode stabilized operation in v-channel substrate inner stripe lasers on p-GaAs substrate emitting in the visible wavelength region" by T. Hayakawa, et. al., J. Appl. Phys. 53(1), November 1982 at pages 7224–34.

Figure 3:
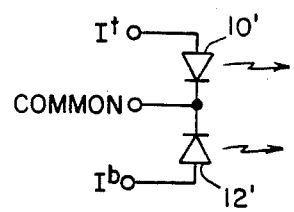
FIG. 3 is a schematic diagram of the CPW laser structure shown in FIG. 1.

This CPW laser device shown in FIG. 1 was operated experimentally under low duty-cycle pulsed conditions, and threshold current of each individual laser cavity was typically, 100 mA. The mode structure of the laser was investigated by observing the spectrally resolved near fields. These were obtained by imaging the near fields on the entrance slit of a spectrometer, using a 20× objective lens, and displaying the output on a monitor using a silicon-vidicon TV camera. The spectrum of each laser could then be obtained by scanning a selected line of the video signal. To facilitate understanding these experiments, it may be helpful to consider the structure as two semiconductor lasers shown schematically in FIG. 3 wherein the top laser cavity 10 is represented by a diode laser 10', and the bottom laser cavity 12 is represented by a diode laser 12', and separately controlled current $I^t$ and $I^b$ for the top and bottom laser cavities, but with optical coupling between the two diode lasesrs indicated by the dashed lines.

The spectrum of the top laser cavity 10 was found to be shifted toward longer wavelengths by 50 Å. This shift occurred because of the smaller bandgap of the top active region, which was p-doped due to the Zn diffusion. When the top laser cavity was operated by itself, its spectral envelope (i.e., the number of longitudinal modes) was considerably narrower than the spectral envelope of the conventional gain-guided lasers. An example of such a spectrum is shown in FIG. 4a. By biasing the bottom laser *below* threshold, it was possible to obtain even narrower spectral envelopes of the top laser. FIG. 4b shows essentially single longitudinal mode operation of the top, *gain-guided* laser cavity, is assisted by the control current in the coupled bottom laser cavity. At still higher currents through the bottom laser cavity, this bottom laser cavity attained threshold, and the two coupled lasers, top and bottom, operated independently, as shown in FIG. 4c.

Figure 5:
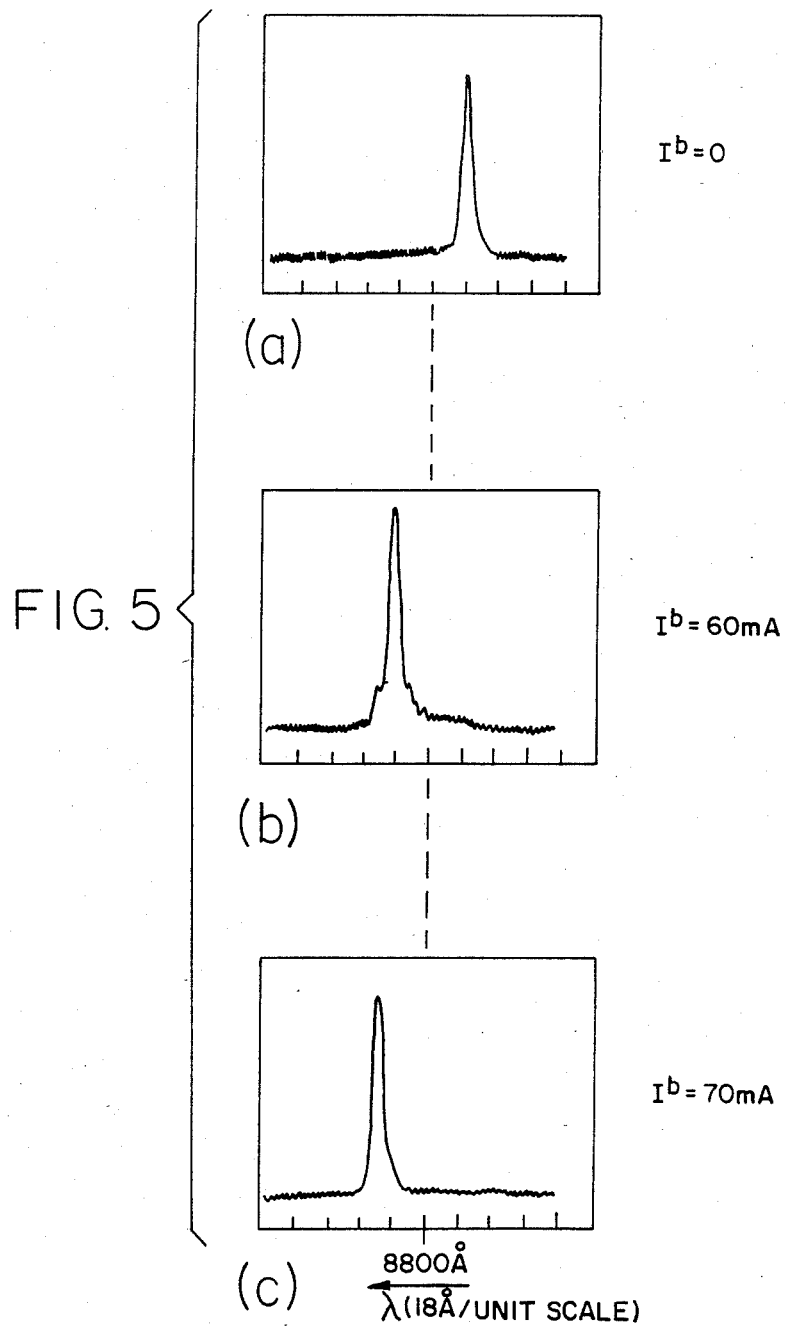
FIGS. 5a, 5b and 5c illustrate the output wavelength tuning of the CPW laser structure of FIG. 1 for a fixed current $I^t$ to the top laser cavity above threshold ($I^t = 1.1\ I_{th}$) and various current $I^b$ to the bottom laser cavity below threshold.

The separate current control of each active region makes it possible to modify the complex dielectric constant of the lower resonator by varying the current applied to it, while the upper laser cavity is biased above threshold. This current variation, in turn, is expected to change the resonance condition of the combined cavity, which can result in wavelength tuning. Such tuning is demonstrated in FIGS. 5a, b and c where the output wavelength of the top laser cavity at 8800 Å is shown to tune toward longer wavelengths by mode hopping, as the control current through the bottom cavity is increased from 0 to 70 mA. Tuning ranges up to 30 Å were achieved in such cases.

The explanation of the frequency control mechanism observed in this PCW laser involves the concept of the eigenmodes ("supermodes") of parallel coupled waveguide configuration. It is well known that near the phase velocity matching point of the two coupled waveguides, the spatial profile of the supermode is a sensitive function of the difference in the phase velocities, and consequently of the wavelength. See W.T. Tsang, et al., Apl. Phys. Lett. 42, 1003 (1983) and A. Yariv, IEEE J. Quantum Electron. QE-9, 919 (1973). It follows that for a given set of input currents ($I_1$, $I_2$) into the two coupled waveguides, the laser will "choose" to operate at the wavelength where the corresponding model profile best "milks" the gain, i.e., where the modal gain is a maximum. This extra agility, i.e., the dependence of mode profile on wavelength is the basis for the tuning mechanism. Since even small differences in modal gain can lead to large tuning, the changes in profile attendant on tuning can be made very small and unobjectionable.

Frequency stability was demonstrated also by the double active layer lasers reported by Tsang, et al., (Appl. Phys. Lett 42(12), supra) in which, however, the two active regions could not be biased separately. From the results presented in the present work, it is clear that the incorporation of separate contacts for the coupled waveguides is essential, particularly if output wavelength tuning is desirable. It should also be noted that by increasing the thickness of the coupling layer 14 (see FIG. 1), one could obtain a two-wavelength laser source. Multiwavelength diode lasers that have been demonstrated previously either did not have the separate control of each wavelength (W. T. Tsang App. Phys. Lett. 36(6), Mar. 15, 1980, and S. Sakai, et al., Electron. Lett. 18 (1) Jan. 7, 1982, 17-19), or incorporated two sources in a lateral configuration. (N. Bouadma, et al., Electron. Lett. 18 (20) Sept. 30, 1982, 871-73.)

Figure 6:
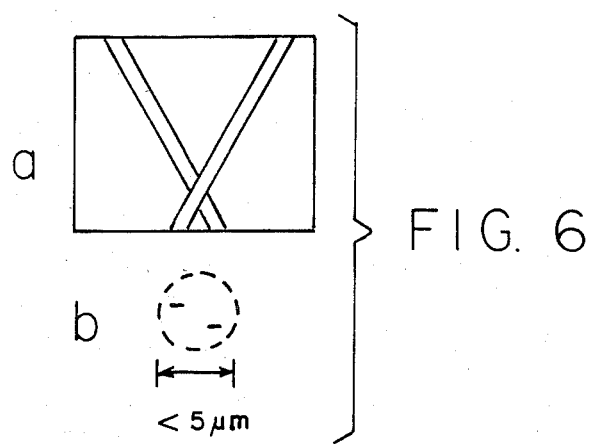
FIGS. 6a and 6b illustrate schematically an alternative geometry for optical coupling of paired stripe lasers emitting in an area less than 5 $\mu$m.
Figure 7:
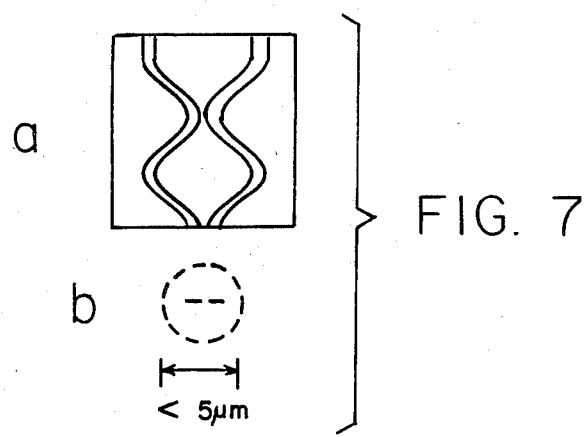
FIGS. 7a and 7b illustrate schematically another geometry for optical coupling of paired stripe lasers emitting in an area less than 5 $\mu$m.
Figure 8:
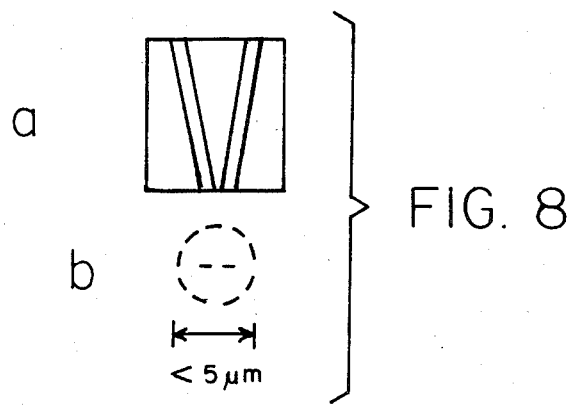
FIGS. 8a and 8b illustrate schematically an alternative geometry for uncoupled stripe lasers emitting in an area less than 5 $\mu$m.

In conclusion, the structure, fabrication and operation of an example of a novel integrated device has been disclosed which incorporates two parallel p-n junction laser cavities, each controlled separately. The lasers are optically coupled in a vertical configuration, i.e., positioned one directly over the other with an optical coupling layer of n-$Al_{0.25}Ga_{0.75}As$, although the two need not be parallel throughout their length; it is sufficient that one be positioned in one active layer such that it will be coupled to the laser cavity in the other active layer through the intermediate coupling layer. For example, the top and bottom cavities may be at an angle and intersect once along their length as shown schematically in FIG. 6a to produce two beams within a circle of a diameter less than about 5 $\mu$m. Alternatively, the two cavities may be sinusoidal in shape and 180° out of phase such that they converge, overlap, or nearly overlap, and then diverge at least once, as shown schematically in FIG. 7a. In that case, both laser cavities may be in the same active layer as shown in FIG. 7b. When two independent laser beams of different wavelengths are desired, the geometry may take many other forms since coupling between them is then not required. For example, the stripe lasers may be disposed at some small angle in the same active layer, as shown schematically in FIG. 8a. The ends are then brought very near each other on the cleaved face of the semiconductor structure, as in the other uses, to provide two beams that emerge within an area less than five microns in diameter as shown schematically in FIG. 8b. Still other geometries will occur to those skilled in the art. But the parallel stripe geometry using separate active layers is believed to be the easiest to work with in fabrication, particularly when it is considered that it is the practice to fabricate a large number of such devices on the same chip. For coupling between the lasers for the purpose of producing a single beam from one laser tuned by independent control of the other below threshold, the parallel stripe cavities in the top active layer are preferably directly over the parallel stripe cavities in the lower layer, or only slightly offset, just so there is the requisite coupling.

Under the present parameters for the present example of a single, tunable laser beam, one of the cavities is operated below threshold and serves the longitudinal mode selection and tunability of the other laser. In particular, it has been demonstrated that by coupling two waveguide lasers, it is possible to obtain a *single* longitudinal-mode operation of one of these, usually multimode lasers. It has also been demonstrated that with a minor modification, namely a reduced coupling between the laser cavities, the device operates as a two-wavelength laser source, with each laser unaffected by the lasing of the other. This reduced coupling may be achieved by a thicker coupling layer, a different coupling layer material, a different layout (geometry) or any combination of these, so long as the lasers are still close enough for both to fit within the area of the end of an optical fiber, as noted above. Consequently, it is intended that the appended claims be interpreted to cover such modifications as equivalents to the preferred embodiment shown.

What is claimed is:

1. A semiconductor stripe laser structure comprised of two stripe laser cavities in different active layers separated by an inactive layer, said laser cavities being disposed to emit their beams in an area less than about five microns, and separate contacts for the coupled stripe lasers, one contact for current to one stripe laser, and the other contact for controls current to the other stripe laser, said cavities being arranged so that there is optical coupling between them, and means for controlling the output wavelength spectrum of one of said coupled cavities through variations of the gain and re-fractive index of the other of the coupled cavities by control of current injection thereto below threshold.

2. A stripe semiconductor laser source comprising two stripe lasers in an integrated circuit structure having a cleaved face, a common contact to both said stripe lasers, and a separate control contact for each stripe laser, said lasers being disposed in said structure to be optically coupled for interacting operation and to emit their beams through said cleaved face in the area less than about five micrometers in diameter.

3. A stripe semiconductor laser source as defined in claim 2 wherein said lasers are disposed to emit their beams one vertically above the other.

4. A stripe semiconductor laser source as defined in claim 2 wherein said lasers are disposed to emit their beams side by side in the same horizontal plane.

5. A stripe semiconductor laser source as defined in claim 2 wherein said lasers are disposed to emit their beams at two different vertical levels offset horizontally from each other.

6. A stripe semiconductor laser as defined in claim 3, 4 or 5 wherein one laser is controlled with current above threshold for lasing, and the other laser is controlled with current below threshold for longitudinal mode selection and tunability of the one laser, thereby producing a single longitudinal-mode operation of said one laser.

7. A stripe semiconductor laser in an integrated circuit structure having a cleaved face comprised of two stripe lasers in separate active layers separated by a nonactive layer, a common contact to both of said lasers through said nonactive layer, and separate control contacts to said stripe lasers on sides of said active layers remote from said nonactive layer, both of said stripe lasers being optically coupled through said nonactive layer, and disposed to emit beams through said cleaved face in an area less than five microns.

8. A stripe semiconductor laser as defined in claim 7 wherein one of said lasers is controlled with current above threshold and the other is controlled with current below threshold to obtain a single longitudinal-mode tunable operation of said one of the lasers.

9. A stripe semiconductor laser as defined in claim 8, wherein said stripe lasers are disposed one directly above the other parallel to each other.

10. A stripe semiconductor laser structure comprised of layered semiconductor material, one a stripe waveguide laser in a layer of active material on top, and the other a stripe interferometric laser formed in a groove in a semiconductor substrate, the index of refraction of the semiconductor substrate being different from an active layer for the second laser, thereby providing reflection at the walls of the groove for lateral mode stability, said stripe waveguide on top being directly over and parallel to said groove, each laser having its active layer of semiconductor material being provided with separate contacts for control current applied thereto, said lasers being separated by a layer of inactive semiconductor material through which a common contact is provided for both lasers, one laser having its control current contact applied in a strip on the top layer, the other having its control current contact applied to said semiconductor substrate, and each laser being controlled by separate currents.

11. A paired stripe semiconductor laser structure as defined in claim 10 wherein said layer of inactive material is not sufficient to prevent optical coupling between strips lasers, and one waveguide laser is operated below threshold to assist the longitudinal mode selection and tuning of the other laser operated above threshold.

12. A paired stripe semiconductor laser structure as defined in claim 11 wherein said layer is sufficient to prevent optical coupling between stripe lasers, whereby a semiconductor structure is provided which emits two independent laser beams of independent wavelength in an area less than about five microns.

13. A paired stripe semiconductor laser structure as defined in claim 10, 11 or 12 wherein said substrate is comprised of $p^+$-GaAs with a single $n^+$GaAs layer grown by liquid-phase epitaxy to a thickness of about 2 $\mu$m and Te doped to about $6\times10^{18}cm^{-3}$, and a deep groove etched parallel to $<011>$ direction, and five successive layers grown by liquid-phase epitaxy: a p-$Al_{0.4}Ga_{0.6}As$ layer about 0.9 $\mu$m; an n-GaAs layer about 0.2 $\mu$m, Sn-doped $6\times10^{-17}cm^{-3}$ for the active layer of one laser; an n-$Al_{0.25}Ga_{0.75}As$ layer for separation of said layers; an n-GaAs layer about 0.2 $\mu$m, Sn-doped $6\times10^{-17}cm^{-3}$ for the active layer of the other laser; and an n-$Al_{0.4}Ga_{0.6}As$ layer about 2 $\mu$m, zinc diffused into said top two layers to convert all of the top layer to $p^+$ type and the next to the top layer to convert the top portion thereof to $p^+$ type, over all but a selected region to one side of said groove, a stripe contact on said top layer above said groove to form one contact of the top laser, a contact to the top active layer in the region not converted to p-type GaAs, thereby to provide a common contact to both lasers, and a contact on the bottom of said substrate to provide a control contact to the bottom stripe laser defined by said groove.

14. A paired stripe semiconductor laser structure as defined in claim 13 wherein the thickness of said n-$Al_{0.25}Ga_{0.75}As$ layer is limited to about 0.9 $\mu$m thick for optical coupling and to a greater thickness for no optical coupling between the top and the bottom lasers.

* * * * *